(12) United States Patent
Kinzer et al.

(10) Patent No.: US 6,194,741 B1
(45) Date of Patent: Feb. 27, 2001

(54) MOSGATED TRENCH TYPE POWER SEMICONDUCTOR WITH SILICON CARBIDE SUBSTRATE AND INCREASED GATE BREAKDOWN VOLTAGE AND REDUCED ON-RESISTANCE

(75) Inventors: Daniel M. Kinzer, El Segundo; Srikant Sridevan, Redondo Beach, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/185,110

(22) Filed: Nov. 3, 1998

(51) Int. Cl.[7] ................................................. H01L 31/0312
(52) U.S. Cl. .............................. 257/77; 257/329; 257/330
(58) Field of Search ...................................... 257/329, 330, 257/77

(56) References Cited

U.S. PATENT DOCUMENTS

| | | |
|---|---|---|
| 4,116,720 | * 9/1978 | Vinson . |
| 5,378,914 | * 1/1995 | Ohzu et al. . |
| 5,770,878 | * 6/1998 | Beasom . |
| 5,831,288 | * 11/1998 | Singh et al. . |
| 5,915,180 | * 6/1999 | Hara et al. . |
| 6,020,600 | * 2/2000 | Miyajima et al. . |

* cited by examiner

Primary Examiner—Stephen D. Meier
(74) Attorney, Agent, or Firm—Ostrolenk, Faber, Gerb & Soffen, LLP

(57) ABSTRACT

A MOSgated trench type power semiconductor device is formed in 4H silicon carbide with the low resistivity direction of the silicon carbide being the direction of current flow in the device drift region. A P type diffusion at the bottom of the U shaped grooves in N− silicon carbide helps prevent breakdown of the gate oxide at the trench bottom edges. The gate oxide may be shaped to increase its thickness at the bottom edges and has a trapezoidal or spherical curvature. The devices may be implemented as depletion mode devices.

5 Claims, 4 Drawing Sheets

MOSGATED TRENCH TYPE POWER SEMICONDUCTOR WITH SILICON CARBIDE SUBSTRATE AND INCREASED GATE BREAKDOWN VOLTAGE AND REDUCED ON-RESISTANCE

BACKGROUND OF THE INVENTION

This invention relates to MOSgated semiconductor devices and more specifically relates to such devices using a silicon carbide (SiC) substrate and with improved gate dielectric breakdown characteristics and increased channel mobility.

It is well known to use silicon carbide as a substrate material for power semiconductor devices. It is also known to use a trench structure for such devices (sometimes called UMOSFETs) in which an invertible channel is formed along the walls of such a trench.

It is known that silicon carbide UMOSFETs can have up to 200 times lower drift region resistance than monocrystaline silicon devices of the same rating. However, UMOSFETs fabricated on SiC have much lower breakdown voltages than is theoretically predicted. This is due to fact that the blocking performance of the SiC trench device is limited by gate dielectric breakdown usually at the trench corner. The highest blocking voltages observed to date on trench MOSFETs in SiC is 1400V (A. K. Agarwal et al., Int. Conf. on SiC, III-N and Related Mat. 1997, Stockholm, Sweden). Gate breakdown at the trench corner was improved by using a thick deposited oxide at the trench bottom and corner. Alternate structures such as Double Implanted MOSFETs (DIMOSFETs, J. N. Shenoy et al., Dev. Res. Conf. 1996), accumulation mode FETs (ACCUFETs, P. M. Shenoy et al., Int. Conf. on SiC, III-N and Related Mat. 1997, Stockholm, Sweden) and epitaxial channel FETs (EC-FETs, K. Hara, Int. Conf. on SiC, III-N and Related Mat. 1997, Stockholm, Sweden) have also been reported.

Silicon carbide comes in many poly types, predominantly "4H" and "6H", made by Cree Research Corp. The mobility of carriers in these 4H and 6H substrates is directionally dependent. Both the lateral and vertical bulk electron mobility of 4H material is relatively high in each direction (about 800 $cm^2$/V.s in the lateral direction and about 1000 $cm^2$/V.s in the vertical direction) whereas the 6H type has a lower lateral mobility (about 400 $cm^2$/V.s) and a substantially lower (about 80 $cm^2$/V.s) bulk electron mobility in the vertical direction. As a result 4H material is the substrate of choice for devices requiring vertical current flow.

It is also desirable to reduce premature breakdown of the device by breakdown of the gate oxide in the corner of the trench. It would further be desirable to create a depletion mode type MOSFET with a SiC substrate and a simplified manufacturing process.

BRIEF SUMMARY OF THE INVENTION

In order to improve the ability of the gate insulation, usually an oxide, which lines the trenches and which has relatively sharp corner edges, it has been found that a shallow junction formed under the bottom of the trench, usually a P type region in an N type silicon substrate, will form a depletion region extending from the bottom of the channel region to the edge of U-groove, thereby electrostatically shielding the gate insulation from high field stress due to source to drain potential under reverse bias. The gate insulation is also be shaped in cross-section to provide a thicker insulation layer at the edge of the groove, and at a given distance from the end of the vertical invertible channel. This increased distance can be formed by causing the interior top of the gate oxide within the U-groove to terminate on a concave radius to define a convex bottom for the polysilicon gate which fills the groove.

As a further feature of the invention, the device trench geometry can be modified to permit construction of a depletion mode MOSFET.

DETAILED DESCRIPTION OF THE DRAWINGS

Figure 1:
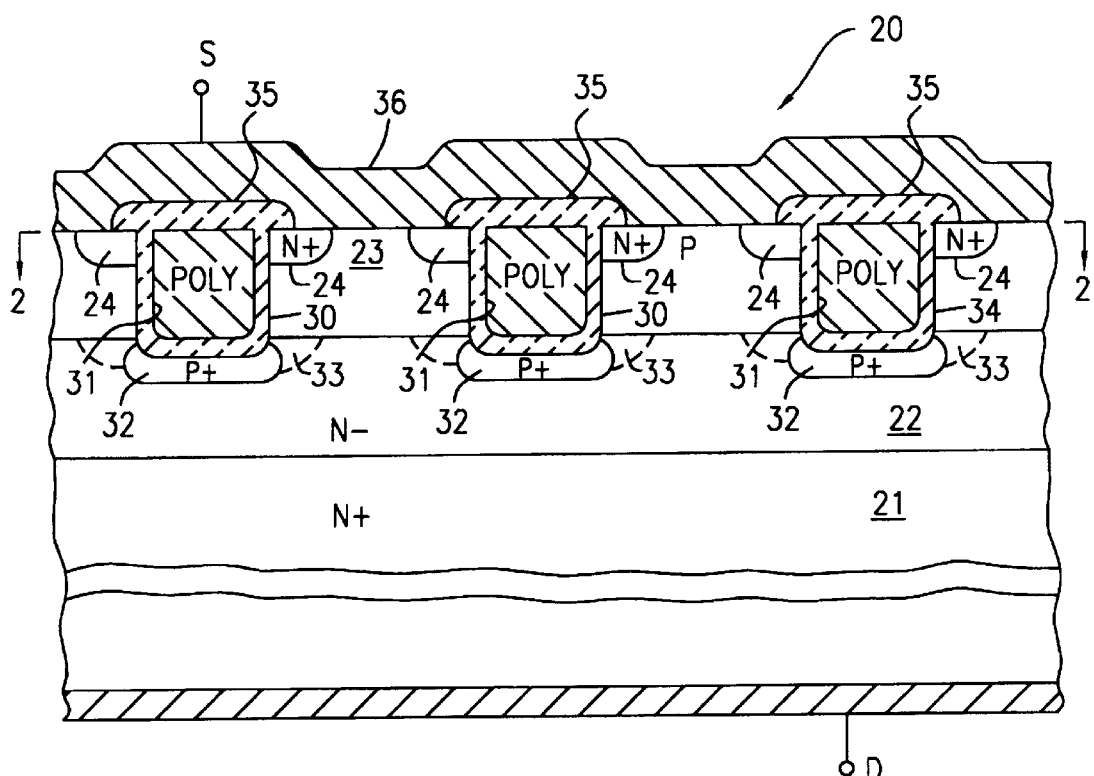
FIG. 1 is a cross-section of a SiC power MOSFET using a U-shaped trench and having a gate dielectric protection P type diffusion.
Figure 2:
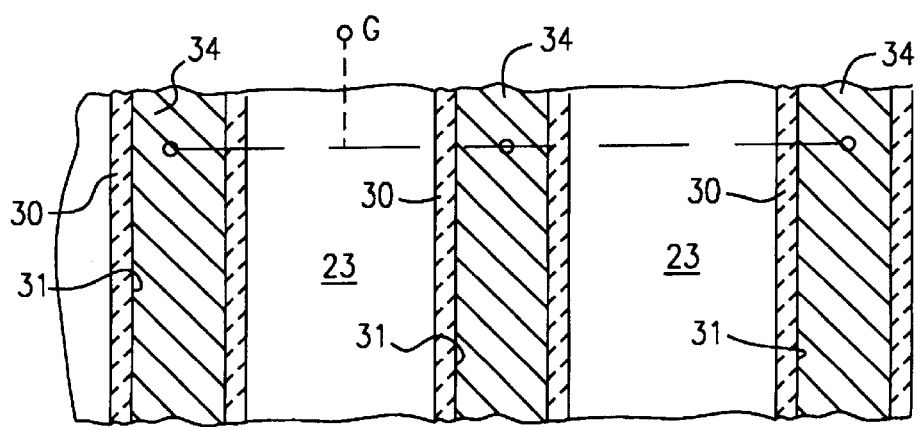
FIG. 2 is a cross-section of FIG. 1 taken across section line 2—2 in FIG. 1.

Referring first to FIGS. 1 and 2, there is shown a small section of a silicon carbide die 20 (a portion of a wafer in which a plurality of identical devices are formed) which may be intended for operation with a reverse voltage rating of 600 volts. The SiC structure includes an N+ substrate 21 which can have a thickness of 200 microns and can be doped with an N type carrier, for example nitrogen, to a concentration of about 2E18. In accordance with one aspect of the invention, the substrate SiC is chosen to be of the 4H type, for trench-type devices, rather than the conventional 6H.

An epitaxially deposited N type SiC drift region 22 having a thickness of about 11.5 microns and a concentration of about 8.5E15 $cm^{-3}$ is deposited atop substrate 21. Other thicknesses and concentrations can be used. The upper surface of drift region 22 is a junction-receiving surface.

A P type blanket diffusion is carried out using boron as a dopant, to form P type region 23 which will define the base or channel region of devices to be formed. P region 23 may have a depth of about 1.0 microns and can be formed using an implant dose of 1E14 (boron) and a subsequent activation anneal to achieve a 1E17 doping concentration. It could also preferentially be formed using epitaxy of Boron doped Silicon Carbide to the required doping (typically 1E17) and thickness (typically 1 micron). A blanket high dose, shallow P type Boron implant, could also be performed to allow a better contact to be formed to the base. Thereafter, a suitable mask is provided and source region strips 24 are formed across the surface areas to receive grooves. The N+ region 24 may be formed with nitrogen at a dose of 1E16 and a subsequent activation anneal to set the N+ junction to a depth of about 0.3 microns.

Thereafter, a plurality of parallel coextensive U-shaped trenches or grooves are formed by etching with only 3 trenches 30 shown in FIGS. 1 and 2. Trenches 30 may have a depth of about 2.5 microns and a width of about 1.5 microns. Trenches 30 cut through both N diffusion 24 and base diffusion 23 to define invertible channel regions within base region 23 along the trench or groove walls. The trenches could be etched, for example, by reactive ion etching or plasma etching using a mixture of, for example, $SF_6/O_2$ or $NF_3O_2$. (M. Kothandaraman et al., "Reactive Ion Etching of Trenches in 6H-SiC", J. of Elec. Mat. vol. 25 no. 5, 1996 pp. 875–878).

Thereafter, the walls of grooves 30 are cleaned, for example, by growing and then etching away a sacrificial oxide, and silicon dioxide, to become the gate oxide, is grown in steam or by deposition within each groove 30, shown as gate oxide layers 31 which may have a thickness of about 500 Å. The clean interface of the oxide to the SiC within the groove will create a low interface state density, and will improve the desired high channel mobility vertically along the invertible channel to be formed in the 4H SiC.

The implant to define P+ diffusions is preferably performed before the gate oxidation and the N source drive. A suitable mask may be used and boron atoms may be implanted into the bottom of each of grooves at a dose of 2E13. These diffusions 32 will act to shield the oxide at the bottom edges of grooves 30 from the high fields due to source to drain potential during reverse bias. Thus, a depletion region 33 will spread out around the edges of each groove, to limit the electric field across the gate oxide in reverse bias.

After the formation of the source regions and the subsequent etching of the trenches, the P implants should be performed and the P-type region at the bottom of the trenches defined. The diffusion step to activate the implants can then be done to simultaneously activate both the source as well as the shield implant. The gate dielectric can then be fabricated, preceded by the sacrificial oxidation step as already outlined.

To complete the device, each groove is filled with a conductive N+ polysilicon gate strip, shown as strips 34 which are remotely connected to a gate terminal as schematically shown in FIG. 2. Note that materials such as any amorphous conductive material, for example, poly-SiC are intended to be included within the term polysilicon herein. Oxide protect strips 35 (FIG. 1) which may be of low temperature oxide (LTO), then cover the polysilicon strips. An aluminum source contact 36 overlies the upper surface of the device and contacts each of source regions 24 and the bases 23. A drain electrode 40 then is applied to the bottom of substrate 21.

It will be apparent that when a gate voltage is applied to the polysilicon gate 34 relative to the source potential of source 36, that an inversion layer is formed vertically along the outer surfaces of grooves and within base regions 23. This permits the flow of high mobility carriers in the 4H SiC of bases 23.

Further, during the reverse bias, the gate oxide 31 at the bottom and edges of grooves 30 is protected against dielectric breakdown due to the potential of the drain to source electrode in reverse bias.

Figure 3:
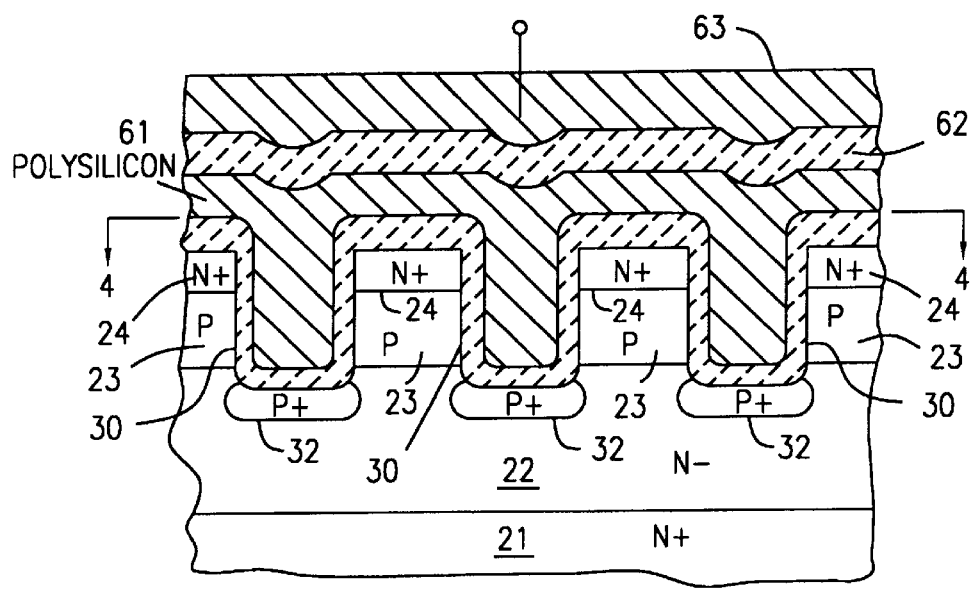
FIG. 3 shows a second embodiment of the invention, employing a remote source contact.
Figure 4:
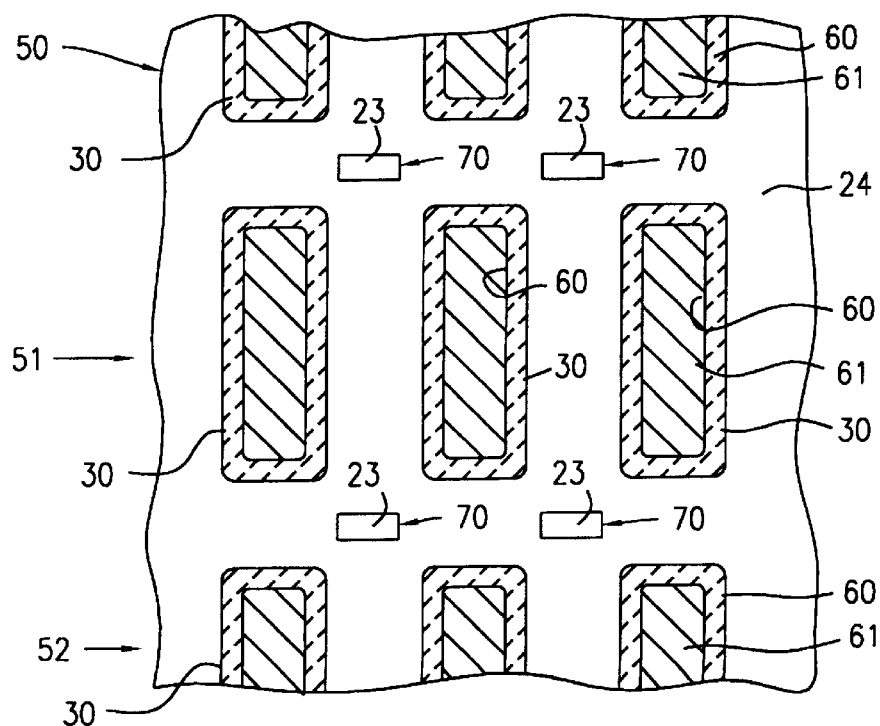
FIG. 4 is a cross-section of FIG. 3 taken across section line 4—4 in FIG. 3.

FIGS. 3 and 4 show a further embodiment of the invention in which the various grooves of FIGS. 1 and 2 are closer together and have a higher density, using a remote source contact construction. Those parts which are otherwise similar to those of FIGS. 1 and 2 have the same identifying numerals.

It will be noted in FIG. 4 that the grooves 30 are laid out in spaced rows 50, 51 and 52 and the spaces between the rows make room for the source contacts which are to be made remotely from the grooves 30. Thus, in FIGS. 3 and 4, grooves 30 are relatively closely spaced, and are lined with a gate oxide layer 60 which extends across the surface of N− layer 22 (and may be thickened at those regions) and are filled with portions of a continuous conductive (N+) polysilicon layer 61 which may be made conductive during its deposition. The upper surface of polysilicon layer 61 is covered with an insulation oxide layer 62 which is in turn covered with an aluminum source contact 63 (FIG. 3).

The aluminum source contact 63 makes contact to the N+ source regions 24 and base regions 23 in the areas 70 between rows such as rows 50, 51 and 52 in FIG. 4.

Note that the embodiments of FIGS. 3 and 4 continue to employ the novel P+ implant 32 at the bottom of each groove 30 (FIG. 3) to protect the gate oxide 60 at the bottom of the grooves. Further, the SiC material of region 22 may be of the 4H variety.

Figure 5:
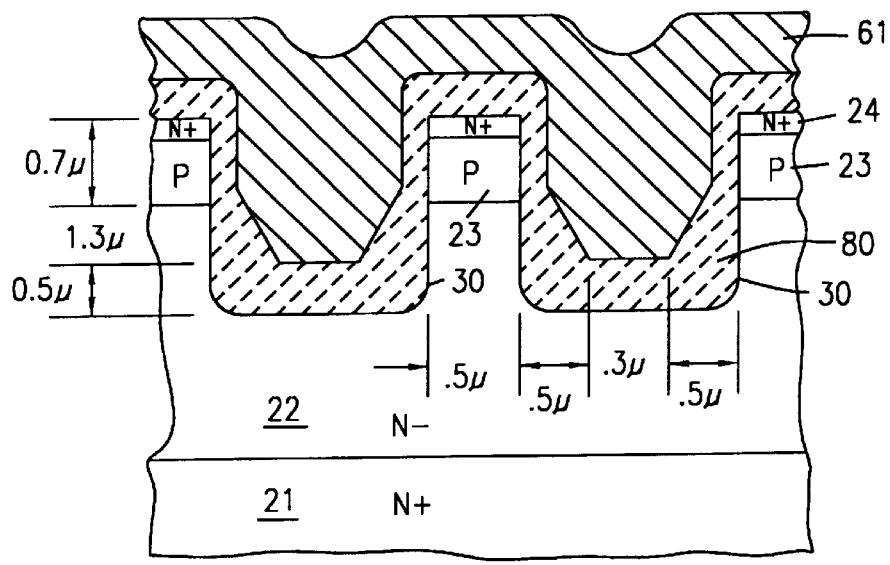
FIG. 5 shows a cross section of a further embodiment of the invention and a device like that of FIGS. 3 and 4, but having a modified trapezoidal gate dielectric shape within the groove.

FIG. 5 shows another embodiment of the invention, like that of FIGS. 3 and 4 in which the gate oxide is reshaped, to thicken it at its bottom and at its bottom edges. In FIG. 5, structures similar to those of FIGS. 1 to 4 carry the same identifying numerals. In FIG. 5, the gate oxide 80 is reshaped as shown, having a channel region 500 Å thick and extending for a depth of about 0.7 microns. Thereafter, the oxide tapers inwardly for a depth of 1.3 microns to a truncated base 81 about 0.3 microns wide. Note the total groove width is 1.3 microns and the 0.3 base leg 81 is symmetrically located within groove 30. Base leg 81 is about 0.5 microns above the bottom of groove 30.

One method by which the oxide profile for gate oxide 80 in FIG. 5 can be made, employs the sequential growth of two oxide layers to fill the trench. The first lines the walls and bottom of each groove and has a relatively high density and low etch rate. The second oxide layer fills the groove and overlies its top and has a lower density than the first layer, and a higher etch rate. Note that the different densities and etch rates can be obtained by different anneal processes or by the use of different doping levels. Thereafter, the wafer is exposed to a hot etch which will etch the outer portions of the lower density layer at a higher rate than the inner layer, thus producing a cross-section of the general shape shown in FIG. 5.

Note that a P+ implant 32 is not shown for the structure of FIG. 5, but can be added as desired.

Figure 6:
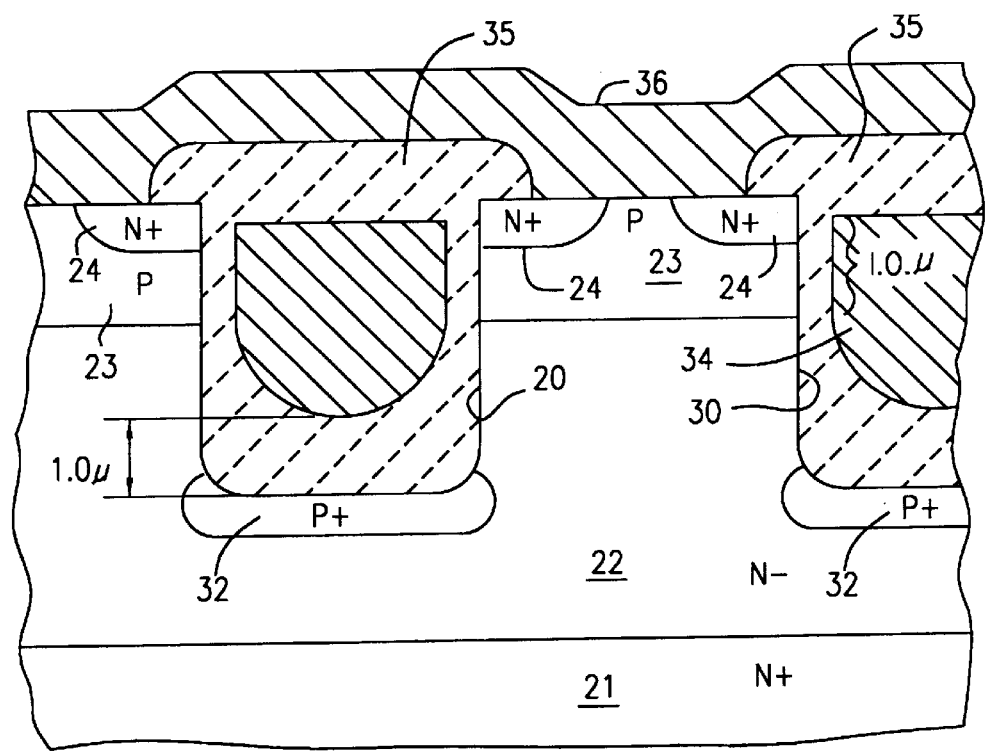
FIG. 6 shows a cross section of a still further embodiment of the invention, similar to that of FIGS. 1 and 2, but having a modified gate oxide structure with a concaved radius at its upper surface.

FIG. 6 shows another embodiment of the invention, as applied to the structure of FIGS. 1 and 2 where, however the gate oxide 31 is reshaped and has a negative radius of curvature of 0.7 microns. The cylindrical concavity in the gate dielectric could be fabricated, for example, by conformally filling the groove with a deposited oxide followed by an isotropic plasma etch or a wet etch. The bottom of polysilicon strip 34 is spaced from the bottom of groove 30 by about 1.0 micron. The channel portion of oxide region 80 is about 1.0 microns long and about 500 Å thick. The bottoms of grooves 80 may be further protected by P+ diffusions 32.

Figure 7:
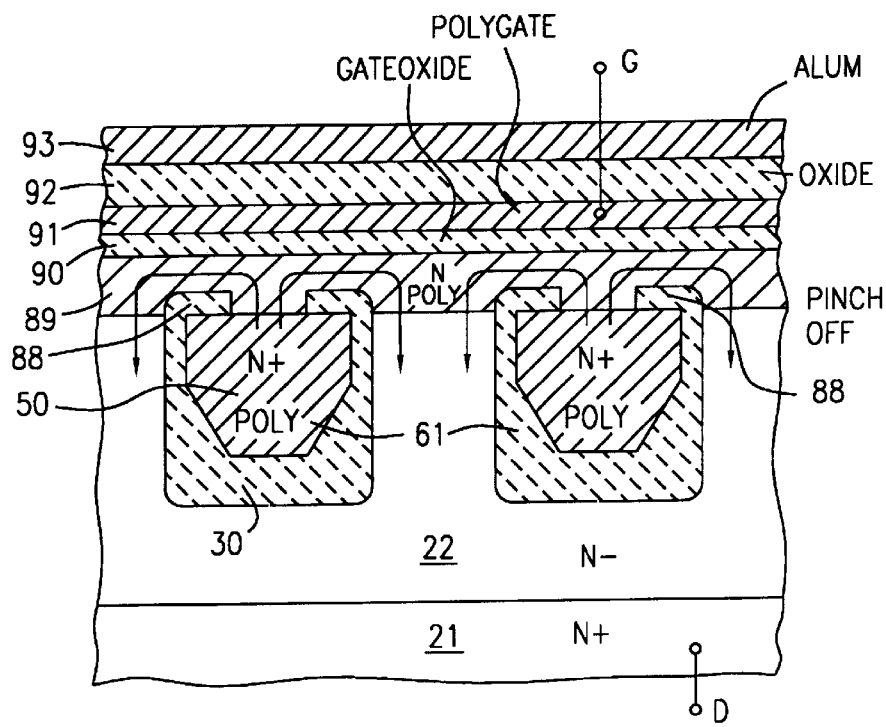
FIG. 7 shows a still further embodiment of the invention, which is like the structure of FIG. 5, but modified to be a depletion mode device.

FIG. 7 shows a structure similar to that of FIG. 5, except modified to be a depletion mode device with P region 23 and N region 24 removed. The structure of FIG. 7 uses the polysilicon strips 61 as a depletion mode source electrode with the remote connection, not shown. The tops of the prior gate oxide 80 now have extending lips 88, which partially overlie the now N+ polysilicon source 61 as shown. An easily depletable N– poly layer 89 about 1000 Å to 2000 Å thick overlies the lips 88 and contacts the now source strips 61. A planar gate oxide layer 90 overlies N– source poly 89. Gate oxide layer 90 is in turn covered by a conductive polysilicon electrode 91. Electrode 91 is in turn covered by an insulation layer 92, which carries a source electrode 93 which is connected to the polysilicon source 61 by a connection, not shown. The gap between gate oxide layer 90 and the tops of oxide 88 overlaps define pinch off depletion regions in the polysilicon conductive layer 89 beneath gate oxide layer 90. Thus, when there is no potential on gate 91, conduction can take place with low resistance from the polysilicon source strips 61, through the overlying polysilicon layer 89 and into the drift region 22 to the drain electrode 40. When a gate potential is applied to gate 91, however, the thin conduction region between gate oxide layer 90 and overlying oxide strips 88 is pinched off (depleted) and conduction between source 61 and drain 40 is terminated. Note that the structure of FIG. 7 benefits significantly from the lower vertical resistivity of 4H silicon carbide in the drift region 22.

Figure 8:
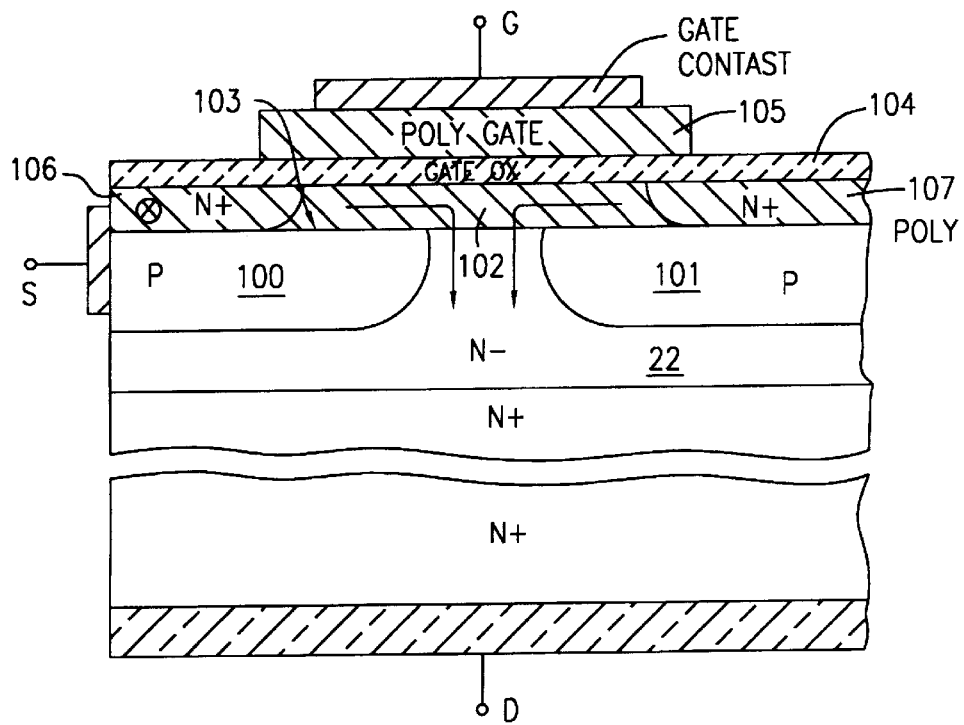
FIG. 8 shows a novel planar geometry depletion mode device made on a SiC substrate like that of FIG. 7.

FIG. 8 shows how a depletion mode device can be made with planar geometry in the silicon carbide wafer of FIG. 1. Thus, the drift region 22 has spaced strips 100 and 101 which are P type diffusions using boron at a dose of 1E18 and driven to a depth of 0.3 microns. A layer 102 of N– polysilicon is formed atop surface 103 of SiC drift region 22. A thin gate oxide layer 104 (500 Å) is then grown atop polysilicon layer 102 and a conductive polysilicon gate 105 is grown atop gate 104 and is patterned to define spaced N+ source diffusions 106 and 107 in the poly layer 102. Source diffusions 106 and 107 are laterally removed from over P regions 100 and 101 to define depletable regions between P regions 100 and 101 (which could be oxide filled trenches) and the opposite ends of the N– polysilicon layer 102.

In operation, applying a potential to gate 105 will cause a pinch off of the channel region in N– polysilicon 102 to pinch off current flow (shown by arrows) from source polysilicon regions 106 and 107 to drift region 22. Note that drift region 22 can advantageously be of 4H silicon carbide.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power MOSgated device comprising a substrate of silicon carbide having an upper surface; a plurality of spaced U shaped grooves formed into the surface of said substrate to a first depth; said substrate having a channel region of one of the conductivity types and which has a second depth beneath said upper surface which is less than said first depth and having a source region of the other of the conductivity types and which has a third depth beneath said upper surface which is less than said second depth; a gate insulation layer disposed within and along the walls of said grooves; a conductive polysilicon gate filling said grooves and spaced from the walls of said grooves by said gate insulation layer; a source contact connected to said channel region and to said source region; a drain contact connected to said substrate at a location remote from said channel region; and a gate contact connected to said polysilicon gates; said silicon carbide consisting of a polycrystalline silicon carbide having a reduced resistivity in the direction of conduction of current in a direction parallel to the vertical walls of said grooves as compared to a resistivity in the direction of conduction of current in a direction perpendicular to the vertical walls of said grooves; and a diffusion of said one conductivity type extending from and beneath the bottoms of each of said grooves to reduce the tendency of dielectric breakdown of said gate insulation at the bottom of said grooves.

2. The device of claim 1 in which said gate insulation comprises silicon dioxide.

3. The device of claim 1 in which said one conductivity type is P.

4. The device of claim 2 in which said one conductivity types is P.

5. A power MOSgated device comprising a substrate of silicon carbide having an upper surface; a plurality of spaced U shaped grooves formed into the surface of said substrate to a first depth; said substrate having a channel region of one of the conductivity types and which has a second depth beneath said upper surface which is less than said first depth and having a source region of the other of the conductivity types and which has a third depth beneath said upper surface which is less than said second depth; a gate insulation layer disposed within and along the walls of said grooves; a conductive polysilicon gate filling said grooves and spaced from the walls of said grooves by said gate insulation layer; a source contact connected to said channel region and to said source region; a drain contact connected to said substrate at a location remote from said channel region; and a gate contact connected to said polysilicon gates; and a diffusion of said one conductivity type extending from and beneath the bottoms of each of said grooves to reduce the tendency of dielectric breakdown of said gate insulation at the bottom of said grooves.

\* \* \* \* \*